(12) United States Patent
Ito et al.

(10) Patent No.: US 10,943,766 B2
(45) Date of Patent: Mar. 9, 2021

(54) POWER FEED MEMBER AND SUBSTRATE PROCESSING APPARATUS

(71) Applicant: Tokyo Electron Limited, Tokyo (JP)

(72) Inventors: Shunichi Ito, Miyagi (JP); Shinji Himori, Miyagi (JP); Etsuji Ito, Miyagi (JP); Naokazu Furuya, Miyagi (JP); Gen Tamamushi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 176 days.

(21) Appl. No.: 16/016,990

(22) Filed: Jun. 25, 2018

(65) Prior Publication Data

US 2018/0374679 A1 Dec. 27, 2018

(30) Foreign Application Priority Data

Jun. 26, 2017 (JP) .............................. JP2017-124344

(51) Int. Cl.
*H01J 37/32* (2006.01)
*H01L 21/683* (2006.01)
*H01L 21/67* (2006.01)
*H01L 21/687* (2006.01)

(52) U.S. Cl.
CPC .. *H01J 37/32027* (2013.01); *H01J 37/32449* (2013.01); *H01J 37/32522* (2013.01); *H01J 37/32697* (2013.01); *H01J 37/32724* (2013.01); *H01L 21/67103* (2013.01); *H01L 21/67109* (2013.01); *H01L 21/6831* (2013.01); *H01L 21/6833* (2013.01); *H01L 21/68792* (2013.01); *H01J 2237/334* (2013.01)

(58) Field of Classification Search
CPC .......... H01J 37/32027; H01J 37/32724; H01J 37/32697; H01J 37/32449; H01J 37/32522; H01J 2237/334; H01L 21/6831; H01L 21/67103; H01L 21/68792; H01L 21/67109; H01L 21/6833
See application file for complete search history.

(56) References Cited

U.S. PATENT DOCUMENTS

| | | | |
|---|---|---|---|
| 6,416,897 B1 * | 7/2002 | Tomlins | H01M 8/0232 429/466 |
| 2005/0023254 A1 * | 2/2005 | Hayashi | H01J 37/32009 219/121.43 |
| 2013/0134591 A1 * | 5/2013 | Sakamoto | H01L 24/07 257/746 |

FOREIGN PATENT DOCUMENTS

| | | |
|---|---|---|
| JP | 2003-282544 A | 10/2003 |
| JP | 2005347620 A | 12/2005 |
| JP | 2006236867 A | 9/2006 |
| JP | 2008019470 A | 1/2008 |

* cited by examiner

*Primary Examiner* — Ram N Kackar
(74) *Attorney, Agent, or Firm* — Pearne & Gordon LLP

(57) ABSTRACT

A power feed member having high heat insulation and capable of transmitting a power at a low loss is provided. The power feed member configured to supply a power includes a first conductive member; a second conductive member; and a connecting member configured to electrically connect the first conductive member and the second conductive member. At least a part of the connecting member is formed of a porous metal or multiple bulk metals.

11 Claims, 13 Drawing Sheets

EXPERIMENTAL EXAMPLE 1

COMPARATIVE EXAMPLE 1

POWER FEED MEMBER AND SUBSTRATE PROCESSING APPARATUS

CROSS-REFERENCE TO RELATED APPLICATION

This application claims the benefit of Japanese Patent Application No. 2017-124344 filed on Jun. 26, 2017, the entire disclosures of which are incorporated herein by reference.

TECHNICAL FIELD

The embodiments described herein pertain generally to a power feed member and a substrate processing apparatus.

BACKGROUND

Conventionally, there is known a parallel plate type plasma processing apparatus which is equipped with a lower electrode which is provided within a processing vessel and serves as a mounting table for a substrate; and an upper electrode provided to face the lower electrode (see, for example, Patent Document 1).

In the parallel plate type plasma processing apparatus, by applying a high frequency power generated by a high frequency power supply to the lower electrode via a matching device and a power feed member such as a power feed rod made of a conductive material, a processing gas within the processing vessel is excited into plasma, so that a plasma processing such as etching is performed on the substrate.

Patent Document 1: Japanese Patent Laid-open Publication No. 2003-282544

SUMMARY

In the above-stated plasma processing apparatus, the power feed member has high thermal conductivity. Thus, when performing a processing on the substrate while adjusting the lower electrode to a high temperature or a low temperature, the temperature of the lower electrode is transferred through the power feed member to adjacent devices such as the matching device, so that temperatures of the adjacent devices may fall out of a temperature range for the proper use thereof. In this regard, there is a demand for a power feed member having high heat insulation and capable of transmitting a power at a low loss.

In view of the foregoing, exemplary embodiments provide a power feed member having high heat insulation and capable of transmitting a power at a low loss.

In an exemplary embodiment, a power feed member configured to supply a power includes a first conductive member; a second conductive member; and a connecting member configured to electrically connect the first conductive member and the second conductive member. At least a part of the connecting member is formed of a porous metal or multiple bulk metals.

According to the above-described exemplary embodiment, the power feed member has high heat insulation and is capable of transmitting a power at a low loss.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
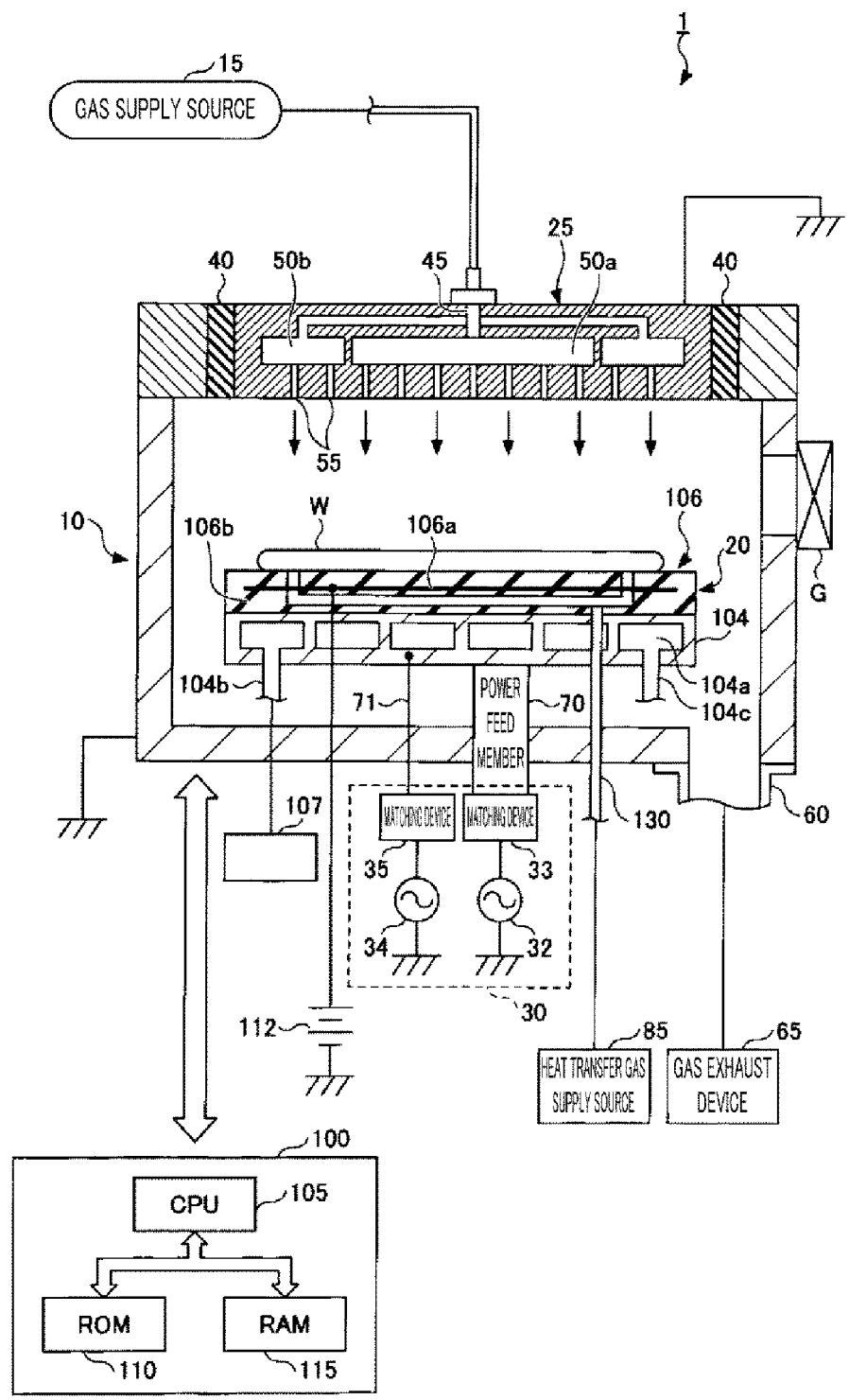
FIG. 1 is a schematic diagram illustrating an etching apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described with reference to the accompanying drawings. In the specification and the various drawings, substantially same parts will be assigned same reference numerals, and redundant description thereof will be omitted.

A power feed member configured to supply a power includes a first conductive member; a second conductive member; and a connecting member configured to electrically connect the first conductive member and the second conductive member. At least a part of the connecting member is formed of a porous metal or multiple bulk metals. Since the connecting member is formed of the porous metal or the multiple bulk metals, heat dissipation effect is improved due to an increase of a surface area and heat insulation effect is bettered due to a decrease of a cross sectional area. Further, since the power feed member is composed of the first conductive member, the second conductive member, and the porous metal or the multiple bulk metals, electrical conductivity can be obtained. As a result, the power feed member has high heat insulation and is capable of transmitting a power at a low loss.

(Substrate Processing Apparatus)

First, an etching apparatus as an example of a substrate processing apparatus to which the power feed member according to the present exemplary embodiment is applicable will be explained. FIG. 1 is a schematic diagram illustrating the etching apparatus according to the present exemplary embodiment.

As depicted in FIG. 1, an etching apparatus 1 is configured as a parallel plate type plasma processing apparatus (capacitively coupled plasma processing apparatus) in which a mounting table 20 and a gas shower head 25 are disposed to face each other within a chamber 10 as a processing vessel. The mounting table 20 has a function of holding a processing target substrate such as a semiconductor wafer (hereinafter, simply referred to as "wafer W") thereon while serving as a lower electrode. The gas shower head 25 has a function of supplying a gas into the chamber 10 in a shower shape while serving as an upper electrode.

The chamber 10 is made of, by way of non-limiting example, aluminum having an alumite-treated (anodically oxidized) surface and has a cylindrical shape. The chamber 10 is electrically grounded. The mounting table 20 is provided at a bottom portion of the chamber 10 and configured to mount the wafer W thereon.

The mounting table 20 is equipped with: a supporting body 104 made of, by way of example, but not limitation, aluminum (Al), titanium (Ti) or silicon carbide (SiC); and an electrostatic chuck 106 forming a top surface of the mounting table 20 and configured to attract the wafer electrostatically. The electrostatic chuck 106 has a structure in which a chuck electrode 106a is embedded in an insulator 106b made of a dielectric material such as, but not limited to, alumina ($Al_2O_3$).

The chuck electrode 106a is connected with a DC voltage source 112, and a DC power is applied from the DC voltage source 112 to the chuck electrode 106a. As a result, the wafer W is attracted to a surface of the electrostatic chuck 106 by a Coulomb force.

A coolant path 104a is provided within the supporting body 104. A coolant inlet line 104b and a coolant outlet line 104c are connected to the coolant path 104a. A coolant such as cooling water or brine outputted from a chiller 107 is circulated through the coolant inlet line 104b, the coolant path 104a and the coolant outlet line 104c. Accordingly, the mounting table 20 and the electrostatic chuck 106 are cooled.

A heat transfer gas supply source 85 is configured to supply a heat transfer gas such as a helium gas (He) or argon gas (Ar) to a rear surface of the wafer W on the electrostatic chuck 106 through a gas supply line 130. With this configuration, a temperature of the electrostatic chuck 106 is controlled by the coolant circulated through the coolant path 104a and the heat transfer gas supplied to the rear surface of the wafer W. As a result, the wafer W can be controlled to have a preset temperature. Further, there may be adopted a configuration in which the wafer W is heated by using a heating source.

The mounting table 20 is connected with a power supply device 30 configured to supply a dual-frequency superposed power. The power supply device 30 includes a first high frequency power supply 32 and a second high frequency power supply 34.

The first high frequency power supply 32 is electrically connected to the mounting table 20 via a first matching device 33 and a power feed member 70. The first high frequency power supply 32 is configured to apply a high frequency power HF (High Frequency) having a first frequency (e.g., 100 MHz) for plasma generation to the mounting table 20. Further, though the high frequency power HF is applied to the mounting table 20 in the present exemplary embodiment, it may be applied to the gas shower head 25.

The second high frequency power supply 34 is electrically connected to the mounting table 20 via a second matching device 35 and a power feed member 71. The second high frequency power supply 34 is configured to apply a high frequency power LF for bias (Low Frequency) having a second frequency (e.g., 13.56 MHz) lower than the first frequency to the mounting table 20.

The first matching device 33 is configured to match a load impedance with an internal (or output) impedance of the first high frequency power supply 32. The first matching device 33 serves to control the internal impedance of the first high frequency power supply 32 and the load impedance to be apparently matched when plasma is generated within the chamber 10.

The second matching device 35 is configured to match a load impedance with an internal (or output) impedance of the second high frequency power supply 34. The second matching device 35 serves to control the internal impedance of the second high frequency power supply 34 and the load impedance to be apparently matched when plasma is generated within the chamber 10.

The power feed member 70 is configured to transmit the high frequency power HF generated by the first high frequency power supply 32 to the mounting table 20. A configuration of the power feed member 70 will be discussed later. The power feed member 71 is configured to transmit the high frequency power LF generated by the second high frequency power supply 34 to the mounting table 20. Though the power feed member 71 is simplified in the illustration of FIG. 1, the power feed member 71 has the same configuration as the power feed member 70.

The gas shower head 25 is disposed to close an opening at a ceiling of the chamber 10 with an insulating member 40 therebetween. The insulating member 40 is configured to insulate a peripheral portion of the gas shower head 25. The gas shower head 25 may be electrically grounded, as shown in FIG. 1. Further, a variable DC power supply may be connected to the gas shower head 25, and a preset DC voltage may be applied to the gas shower head 25.

The gas shower head 25 is provided with a gas inlet opening 45 through which a gas is introduced. A center-side diffusion space 50a and an edge-side diffusion space 50b branched from the gas inlet opening 45 are provided within the gas shower head 25. A gas supplied from a gas supply source 15 is supplied into the diffusion spaces 50a and 50b through the gas inlet opening 45 and diffused through the individual diffusion spaces 50*a* and 50*b* to be introduced toward the mounting table 20 from a multiple number of gas supply holes 55.

A gas exhaust opening 60 is formed at a bottom surface of the chamber 10, and the inside of the chamber 10 is decompressed by a gas exhaust device 65 which is connected to the gas exhaust opening 60 via a gas exhaust line. Accordingly, the inside of the chamber 10 can be maintained at a predetermined vacuum level. A gate valve G is provided at a sidewall of the chamber 10. The wafer W is carried into and out of the chamber 10 as the gate valve G is opened/closed.

The etching apparatus 1 is equipped with a control unit 100 configured to control an overall operation of the apparatus. The control unit 100 includes a CPU (Central Processing Unit) 105, a ROM (Read Only Memory) 110 and a RAM (Random Access Memory) 115. The CPU 105 performs a required processing such as etching to be descried later based on various kinds of recipes stored in these memory devices. Recorded in the recipes is control information of the apparatus upon processing conditions such as a processing time, a pressure (gas exhaust), a high frequency power or voltage, various gas flow rates, temperatures within the chamber (a temperature of the upper electrode, a temperature of the sidewall of the chamber, a temperature of the electrostatic chuck, etc.), temperature of the chiller 107, and so forth. These programs or recipes indicating the processing conditions may be stored in a hard disk or a semiconductor memory. Further, the recipes may be set to a preset position in the memory device while being stored in a computer-readable portable storage medium such as a CD-ROM or a DVD.

To perform an etching processing, opening/closing of the gate valve G is controlled, and the wafer W is carried into the chamber 10 to be mounted on the mounting table 20. As a direct current is supplied to the chuck electrode 106*a* from the DC voltage source 112, the wafer W is attracted to and held by the electrostatic chuck 106 by the Coulomb force.

Subsequently, an etching gas, a high frequency power HF for plasma generation and a high frequency power LF for bias are supplied into the chamber 10, so that plasma is generated. A plasma etching processing is performed on the wafer W by the generated plasma.

After the etching processing, a DC voltage HV having an opposite polarity that of to the DC voltage applied to attract the wafer W is applied from the DC voltage source 112 to the chuck electrode 106*a*, so that electric charges of the wafer W are neutralized, and the wafer W is released from the electrostatic chuck 106. Then, after the opening/closing of the gate valve G is controlled, the wafer W is carried out of the chamber 10.

The power feed member 70 is required to transmit a high frequency power at a low loss. For the purpose, a bulk metal (e.g., Al, Cu, etc.) having low electrical resistance has been used. However, most of these metals have high thermal conductivity.

For the reason, when performing a processing on the wafer W while adjusting the mounting table 20 to a high temperature or a low temperature, the temperature of the mounting table 20 may be transferred to the adjacent devices such as the first matching device 33 through the power feed member 70, so that the temperature of the adjacent device goes out of the temperature range for the proper use thereof.

Accordingly, the present inventors have conducted thorough investigation over the problems of the prior art and found out that, by using a power feed member having a first conductive member; a second conductive member; and a connecting member made of a porous metal or a plurality of bulk metals and configured to electrically connect the first conductive member and the second conductive member, it is possible to transmit a power at a low loss while obtaining high heat insulation. In the following, a power feed member according to the present exemplary embodiment capable of transmitting a power at a low loss while obtaining high heat insulation will be described.

(Power Feed Member)

Figure 2:
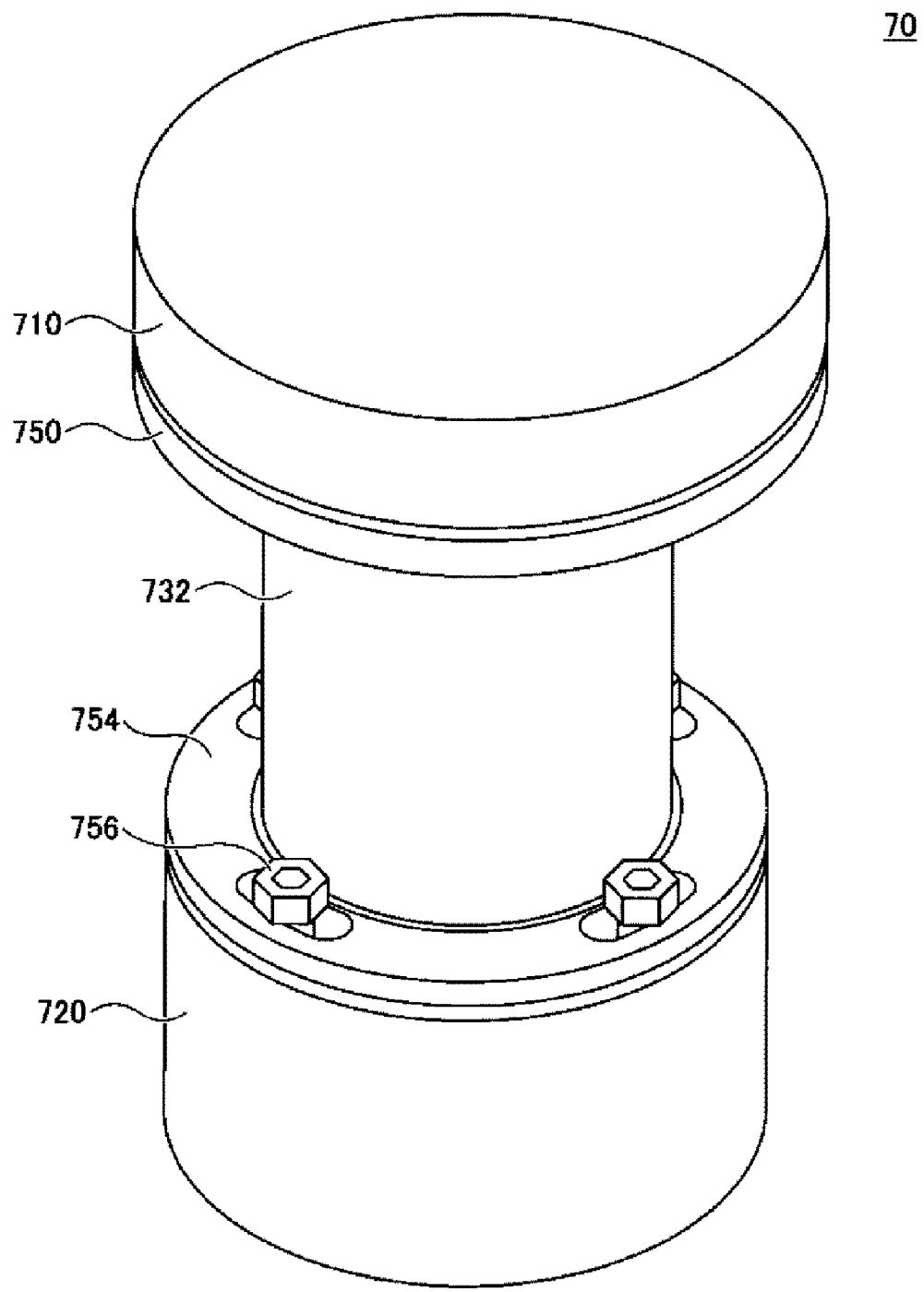
FIG. 2 is a diagram illustrating an example of a power feed member according to the exemplary embodiment.
Figure 3:
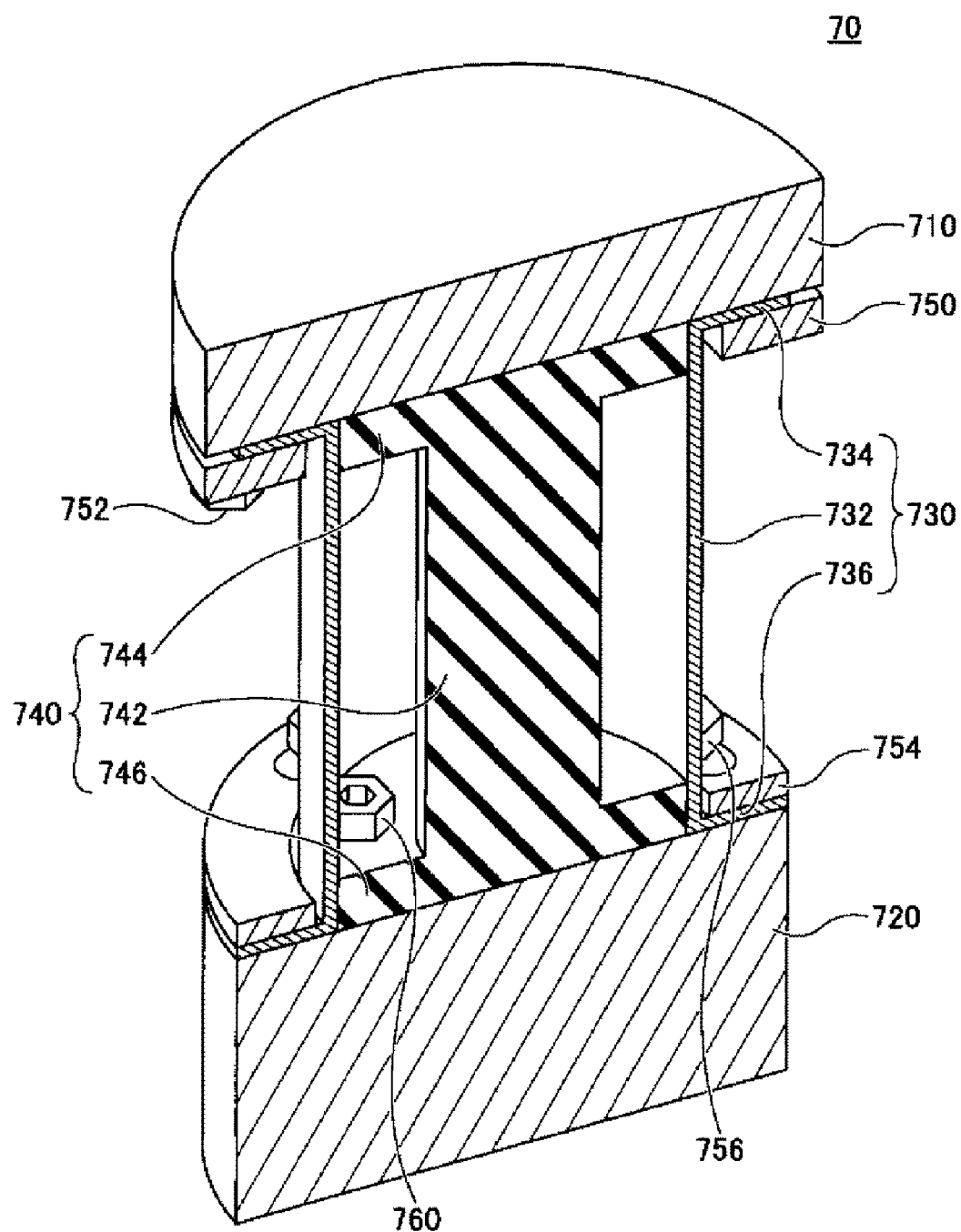
FIG. 3 is a longitudinal cross sectional view of the power feed member of FIG. 2 taken along a central axis thereof.
Figure 4:
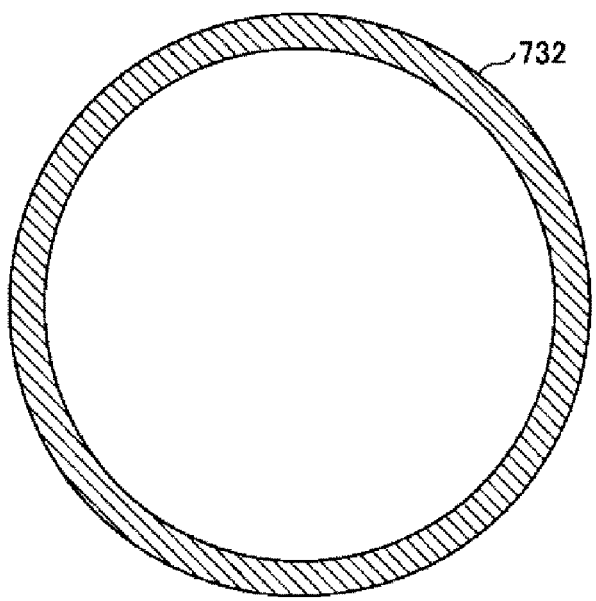
FIG. 4 is a diagram illustrating a cross sectional shape of a connecting member of the power feed member of FIG. 2.

The power feed member 70 according to the present exemplary embodiment will be explained. FIG. 2 is a diagram showing an example of the power feed member 70 according to the exemplary embodiment. FIG. 3 is a longitudinal cross sectional view taken along a central axis of the power feed member 70 shown in FIG. 2. FIG. 4 is a diagram illustrating a cross sectional shape of a connecting member of the power feed member 70 shown in FIG. 2.

The power feed member 70 according to the present exemplary embodiment is used to electrically connect the mounting table 20 and the first matching device 33 in a detachable manner and supply the high frequency power HF generated by the first high frequency power supply 32 to the mounting table 20.

As depicted in FIG. 2 and FIG. 3, the power feed member 70 includes a first conductive member 710, a second conductive member 720, a connecting member 730 and a supporting member 740.

The first conductive member 710 has a disk shape. The first conductive member 710 is made of a bulk metal such as, but not limited to, Al, Cu, or the like. A top surface of the first conductive member 710 is configured to be electrically connected to the mounting table 20.

The second conductive member 720 is disposed to face the first conductive member 710 with a preset distance therebetween. The second conductive member 720 has a disk shape, the same as the first conductive member 710. The second conductive member 720 is made of a bulk metal such as, but not limited to, Al, Cu, or the like. A bottom surface of the second conductive member 720 is configured to be electrically connected to the first matching device 33. Further, though the first conductive member 710 and the second conductive member 720 are disposed to face each other in the present exemplary embodiment, the two conductive members 710 and 720 may be electrically connected even in a configuration where they do not face each other.

The connecting member 730 is configured to electrically connect the first conductive member 710 and the second conductive member 720. The connecting member 730 includes a hollow cylindrical portion 732; an upper flange portion 734 extended outwards from an upper end of the cylindrical portion 732 in a radial direction; and a lower flange portion 736 extended outwards from a lower end of the cylindrical portion 732 in the radial direction.

The upper flange portion 734 is fixed to the first conductive member 710 by using an annular pressing member 750 having an inner diameter larger than a diameter of the cylindrical portion 732 and a fastening member 752 such as a bolt. Accordingly, the upper flange portion 734 is electrically connected with the first conductive member 710.

The lower flange portion 736 is fixed to the second conductive member 720 by using an annular pressing member 754 having an inner diameter larger than the diameter of the cylindrical portion 732 and a fastening member 756 such as a bolt. Accordingly, the lower flange portion 736 is electrically connected with the second conductive member 720.

In this configuration, the high frequency power HF generated by the first high frequency power supply 32 is supplied to the mounting table 20 via the second conductive member 720, the connecting member 730 and the first conductive member 710.

According to the present exemplary embodiment, the connecting member 730 is made of a porous metal which is processed to have a sheet shape (hereinafter, referred to as "porous metal sheet"). Such a porous metal sheet may be implemented by a sheet in which metal fibers are distributed without being oriented, for example, a felt of the metal fibers or a sintered body of the metal fibers. A material of the metal fiber may be, by way of non-limiting example, stainless steel (SUS), copper (Cu), aluminum (Al), silver (Ag), or the like. From a point of view of the electrical conductivity, it is desirable that a fiber diameter of the metal fiber is larger than a skin depth d which is determined based on a frequency of the high frequency power HF applied to the mounting table 20. Further, the skin depth d is defined by Expression 1 to be described later. Furthermore, a sheet made of a metallic material having a multiple number of pores, such as a foamed metal, may be used as the porous metal sheet. Besides, a plurality of porous metal sheets may be stacked on top of each other.

The supporting member 740 is formed of an insulating member having heat insulation. The supporting member 740 includes a circular column-shaped portion 742; an upper flange portion 744 extended outwards from one end (upper end) of the circular column-shaped portion 742 in the radial direction; and a lower flange portion 746 extended outwards from the other end (lower end) of the circular column-shaped portion 742 in the radial direction.

A heat transfer gas supply path (not shown) through which a heat transfer gas such as dry air is flown to be supplied into an internal space of the cylindrical portion 732 of the connecting member 730 may be formed within the circular column-shaped portion 742. By providing a heat transfer gas supply unit, it is possible to cool the cylindrical portion 732 of the connecting member 730 by the heat transfer gas. As a result, the heat dissipation can be improved. The upper flange portion 744 is fixed to the first conductive member 710 by a fastening member (not shown) such as a bolt. The lower flange portion 746 is fixed to the second conductive member 720 by a fastening member 760 such as a bolt. When an external force is applied to the power feed member 70 from above or below it, the supporting member 740 is capable of suppressing deformation of the connecting member 730 made of the porous metal sheet.

Effects

Now, effects of the power feed member 70 according to the present exemplary embodiment will be explained.

Figure 5:
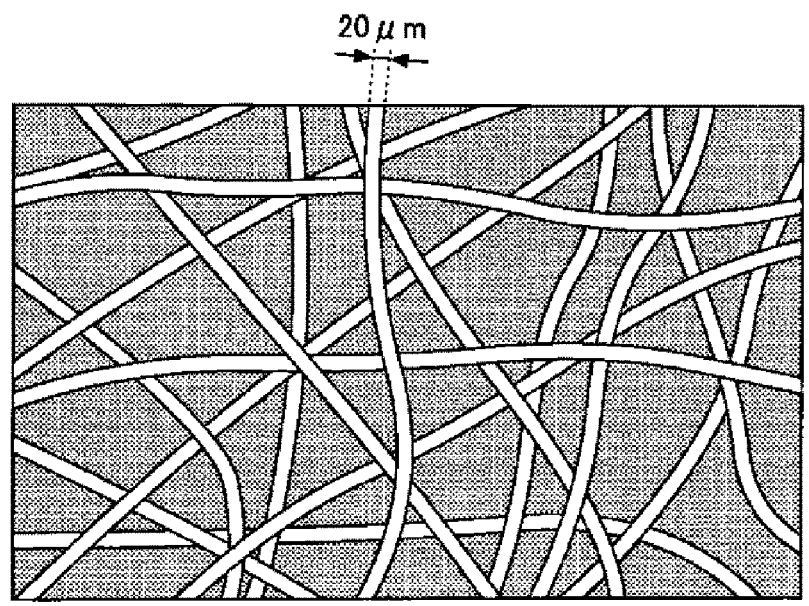
FIG. 5 is a schematic diagram illustrating an example of a porous metal sheet.

First, the heat insulation of the porous metal sheet forming the connecting member 730 of the power feed member 70 will be discussed. FIG. 5 is a schematic diagram illustrating an example of the porous metal sheet. As depicted in FIG. 5, the porous metal sheet is made of metal fibers having a fiber diameter of 10 μm to 20 μm. As multiple gaps are formed between the fine metal fibers, a contact area between the heat transfer gas and the metal fibers is increased, so that the heat dissipation is improved. Furthermore, as a cross sectional area of the metal fiber is small, the heat insulation is also improved.

Now, the electrical conductivity of the porous metal sheet forming the connecting member 730 of the power feed member 70 will be explained. When an AC current flows in a conductor, there occurs a skin effect, so that a current density is highest near a surface of the conductor and decreases with an increase of a distance from the surface. Since, due to the skin effect, the alternating current is concentrated at the surface of the conductor as a frequency of the alternating current increases, AC resistance of the conductor is increased. To be more specific, the skin depth d, which is defined as a depth at which the current falls to 1/e of the current flowing near the surface of the conductor, is calculated by the following Expression 1.

[Expression 1]

$$d = \sqrt{\frac{2}{\omega \mu \sigma}} \quad (1)$$

d: skin depth
σ: conductivity of the conductor
μ: magnetic permeability of the conductor
ω: angular frequency of the current By way of example, when transmitting the high frequency power of 100 MHz to the conductor made of copper, the skin depth d is calculated to be 6.5 μm according to the Expression 1.

Figure 6A:
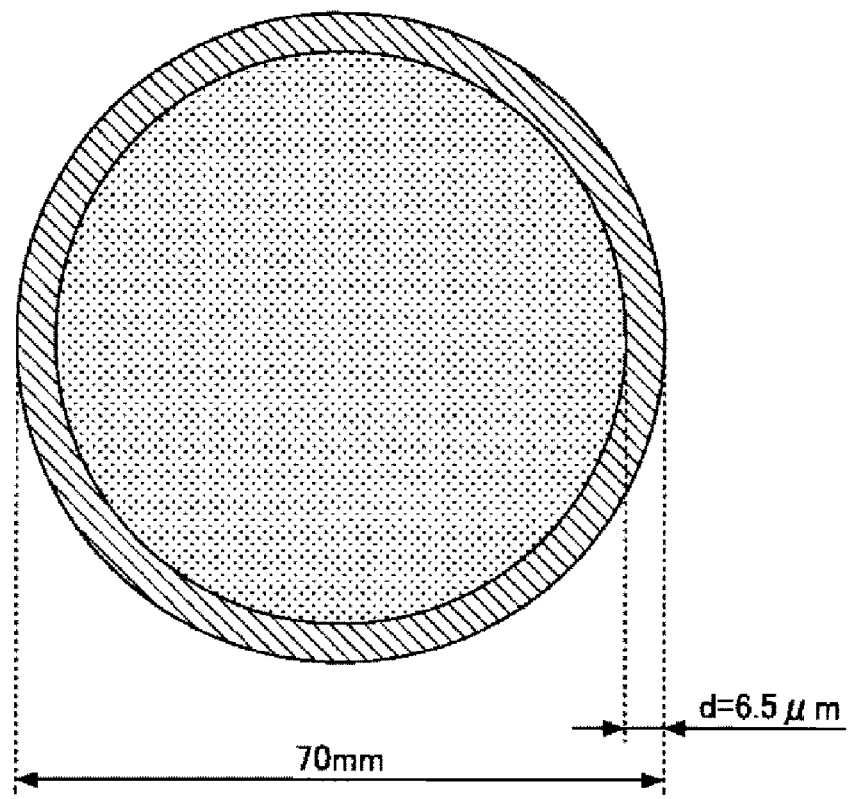
FIG. 6A and FIG. 6B are diagrams for describing a skin effect.
Figure 6B:
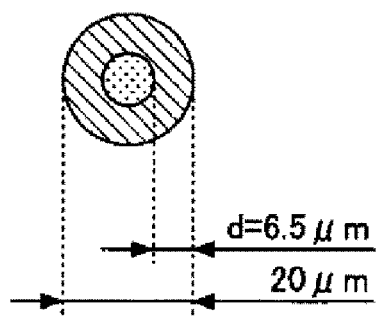

FIG. 6A and FIG. 6B are diagrams for describing the skin effect. FIG. 6A shows a cross section of a copper bulk as an example of the bulk metal, and FIG. 6B shows a cross section of a copper fiber as an example of the metal fiber.

As shown in FIG. 6A, when the high frequency power of 100 MHz is transmitted in the copper bulk having a cross sectional diameter of 70 mm, the alternating current is concentrated at the surface of the copper bulk (d=6.5 μm). As a result, the AC resistance is increased.

In contrast, as shown in FIG. 6B, in case of transmitting the high frequency power of 100 MHz in the copper fiber having the fiber diameter of 20 μm, the alternating current flows at the most part of the copper fiber (d=6.5 μm). Accordingly, utilization of an area around the single metal fiber contributing to the transmission of the high frequency power is improved. Therefore, a metal sheet composed of a large number of metal fibers has a low AC resistance as compared to the bulk metal having the same size. As a result, the power can be transmitted at a low loss.

Modification Examples

Figure 7:
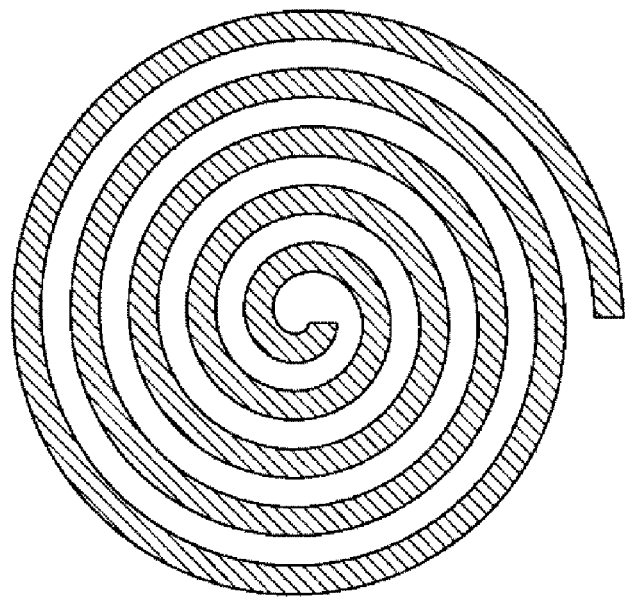
FIG. 7 is a diagram illustrating a cross sectional shape of another example of the connecting member of the power feed member according to the exemplary embodiment.
Figure 8:
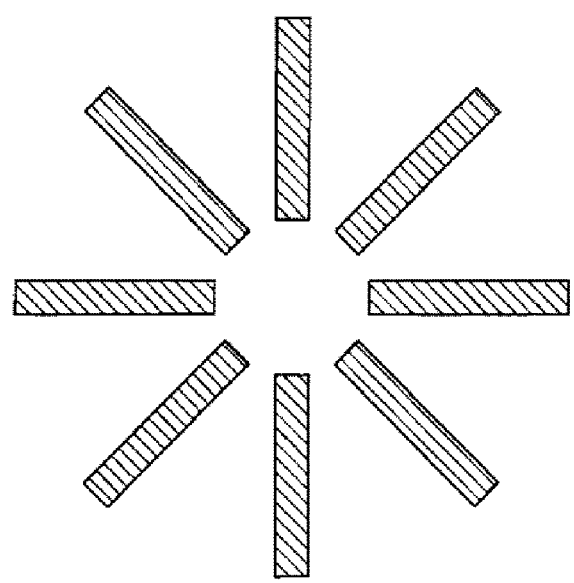
FIG. 8 is a diagram illustrating a cross sectional shape of yet another example of the connecting member of the power feed member according to the exemplary embodiment.
Figure 9:
FIG. 9 is a diagram illustrating a cross sectional shape of still yet another example of the connecting member of the power feed member according to the exemplary embodiment.
Figure 9:
Figure 9:

Now, modification examples of the connecting member 730 of the power feed member 70 according to the present exemplary embodiment will be described. FIG. 7 to FIG. 9 are diagrams for describing a cross sectional shape of various other examples of the connecting member of the power feed member according to the present exemplary embodiment.

In FIG. 2 to FIG. 4, the connecting member 730 of the power feed member 70 is shown to have the cylindrical shape (annular cross sectional shape). However, the shape of the connecting member 730 is not limited thereto.

The connecting member 730 may be prepared by changing the porous metal sheet in various shapes. As illustrated in FIG. 7, for example, the connecting member 730 may be made of the porous metal sheet in a roll shape. With this configuration, a larger heat dissipation area is obtained, so that the heat dissipation is improved.

Furthermore, the connecting member 730 may be composed of a plurality of porous metals each processed to have a plate shape (hereinafter, referred to as "porous metal plates"). As depicted in FIG. 8, for example, the connecting member 730 may be composed of a plurality of (e.g., eight) porous metal plates which are arranged radially. With this configuration, a larger heat dissipation area is obtained, so that the heat dissipation is improved. Furthermore, it is desirable to arrange the plurality of porous metal plates at symmetrical positions without having a structural unbalance. Further, a part or all of the plurality of porous metal plates may be replaced by a bulk metal(s) processed to have a plate shape.

In addition, the connecting member 730 may be composed of a plurality of porous metals each processed to have a bar shape (hereinafter, referred to as "porous metal bars"). As shown in FIG. 9, for example, the connecting member 730 may have a configuration in which a plurality of (e.g., nine) porous metal bars are arranged in a lattice pattern. With this configuration, a larger heat dissipation area is obtained, so that the heat dissipation can be improved. Moreover, it is desirable to arrange the plurality of porous metal bars at symmetrical positions without having a structural unbalance. Further, a part or all of the plurality of porous metal bars may be replaced by a bulk metal(s) processed to have a bar shape.

Furthermore, the connecting members 730 may have a complex structure combined all of the above examples. Further, a part of the connecting member 730 may be formed of the aforementioned porous metal or a plurality of bulk metals.

Experimental Examples

Now, the heat insulation and the electrical conductivity of the power feed member having the connecting member formed of the porous metal sheet will be described in detail.

Figure 10A:
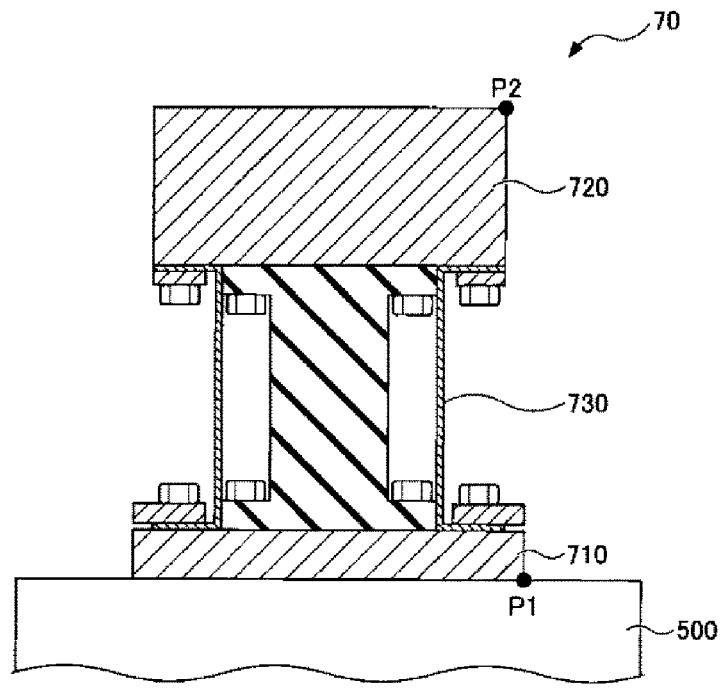
FIG. 10A and FIG. 10B are diagrams illustrating a tester for evaluating heat insulation.
Figure 10B:
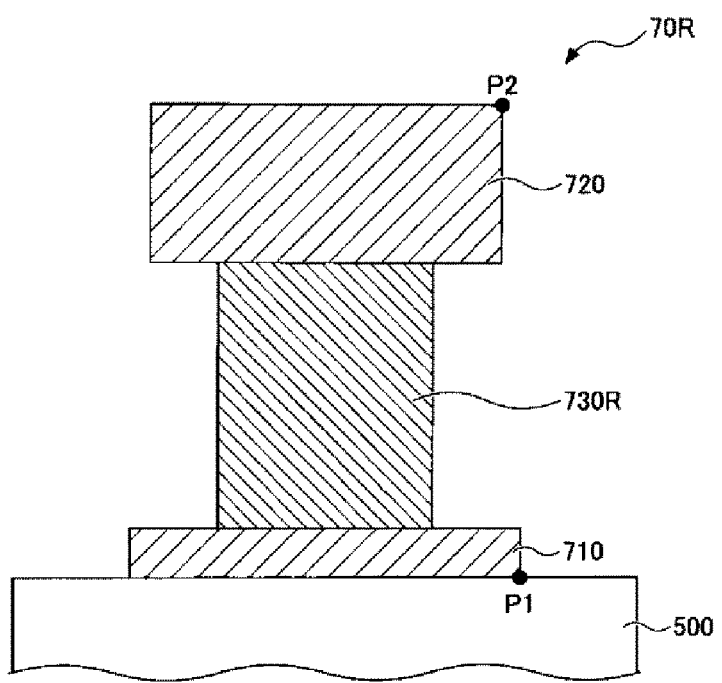

First, the heat insulation of the power feed member having the connecting member formed of the porous metal sheet will be explained. FIG. 10A and FIG. 10B are diagrams for describing a tester for evaluating the heat insulation. As shown in FIG. 10A, the power feed member 70 having the connecting member 730 made of the porous metal sheet is placed on a hot plate 500, and the hot plate 500 is heated such that a surface temperature thereof reaches 150° C. (experimental example 1). At this time, the connecting member 730 is placed on the hot plate 500 such that the first conductive member 710 is positioned at a lower side, and the second conductive member 720 is positioned at an upper side. Further, for the comparison, a power feed member 70R having a connecting member 730R formed of the bulk metal is placed on the hot plate 500, as shown in FIG. 10B, and the hot plate 500 is heated such that the surface temperature thereof reaches 150° C. (comparative example 1). At this time, the connecting member 730R is placed on the hot plate 500 such that the first conductive member 710 is positioned at the lower side, and the second conductive member 720 is positioned at the upper side. Further, in the state that the power feed member 70 (70R) is heated, a temperature of the first conductive member 710 (a temperature of a position marked with p1 in the drawing) and a temperature of the second conductive member 720 (a temperature of a position marked with p2 in the drawing) are measured. In the present experimental example, a distance between the position p1 and the position p2 is 120 mm.

Figure 11A:
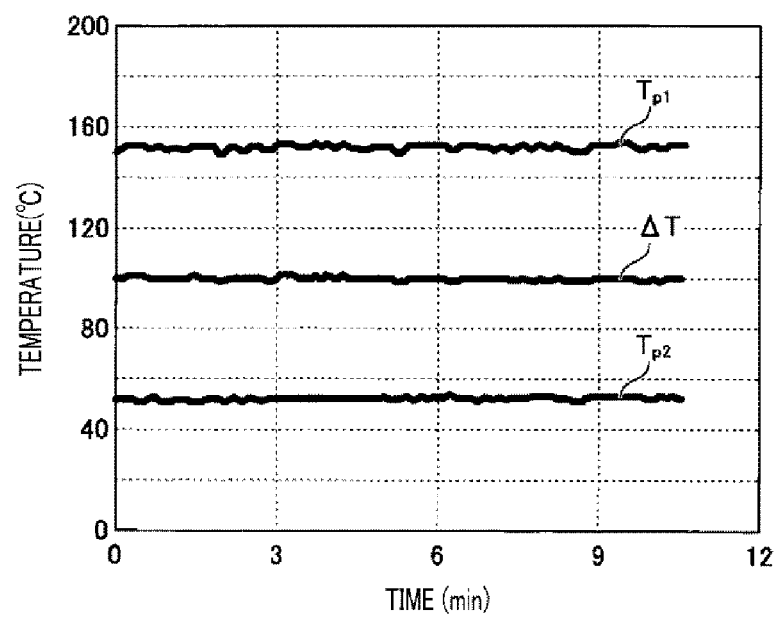
FIG. 11A and FIG. 11B are diagrams showing evaluation results of the heat insulation.
Figure 11B:
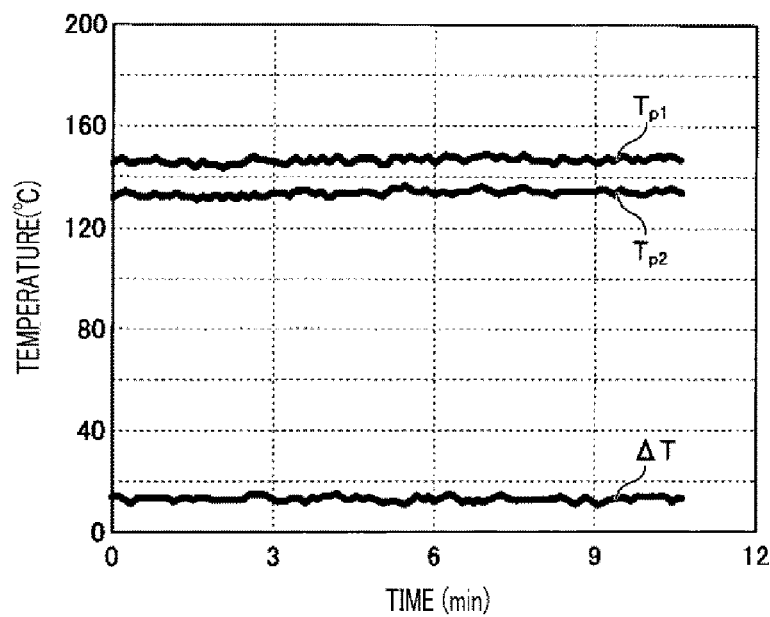

FIG. 11A and FIG. 11B are diagrams showing results of the evaluation of the heat insulation. FIG. 11A shows an evaluation result of the experimental example 1, and FIG. 11B shows an evaluation result of the comparative example 1. In FIG. 11A and FIG. 11B, a horizontal axis represents a time (min), and a vertical axis indicates a temperature (° C.). Further, in FIG. 11A and FIG. 11B, $T_{p1}$ denotes the temperature of the position p1 in FIG. 10A and FIG. 10B; $T_{p2}$, the temperature of the position p2 in FIG. 10A and FIG. 10B; AT, a temperature difference $(T_{p1}-T_{p2})$ between the position p1 and the position p2.

As can be seen from FIG. 11A, in the experimental example 1, the temperature difference between the position p1 and the position p2 is found to be about 100° C. Meanwhile, in the comparative example 1, the temperature difference between the position p1 and the position p2 is found to be not greater than 20° C. On this ground, it is found out that the power feed member 70 having the connecting member 730 formed of the porous metal sheet has the higher heat insulation than the power feed member 70R having the connecting member 730R formed of the bulk member.

An etching characteristic in case of performing a plasma etching processing on the wafer W under a first condition by using, as each of the power feed members 70 and 71 shown in FIG. 1, the power feed member having the connecting member made of the porous metal sheet is evaluated (experimental example 2). Further, for the comparison, an etching characteristic in case of performing the plasma etching processing on the wafer W under the first condition by using, as each of the power feed members 70 and 71 shown in FIG. 1, the power feed member having the connecting member made of the bulk metal is evaluated (comparative example 2). The first condition is as follows.

<First Condition>
Pressure: 50 mTorr (6.7 Pa)
High frequency power HF: 2400 W
High frequency power LF: 0 W
Etching gas: $CF_4$ (150 sccm)
Etching time: 1 min
Wafer W: $SiO_2$/Si (ϕ300 mm)

Figure 12:
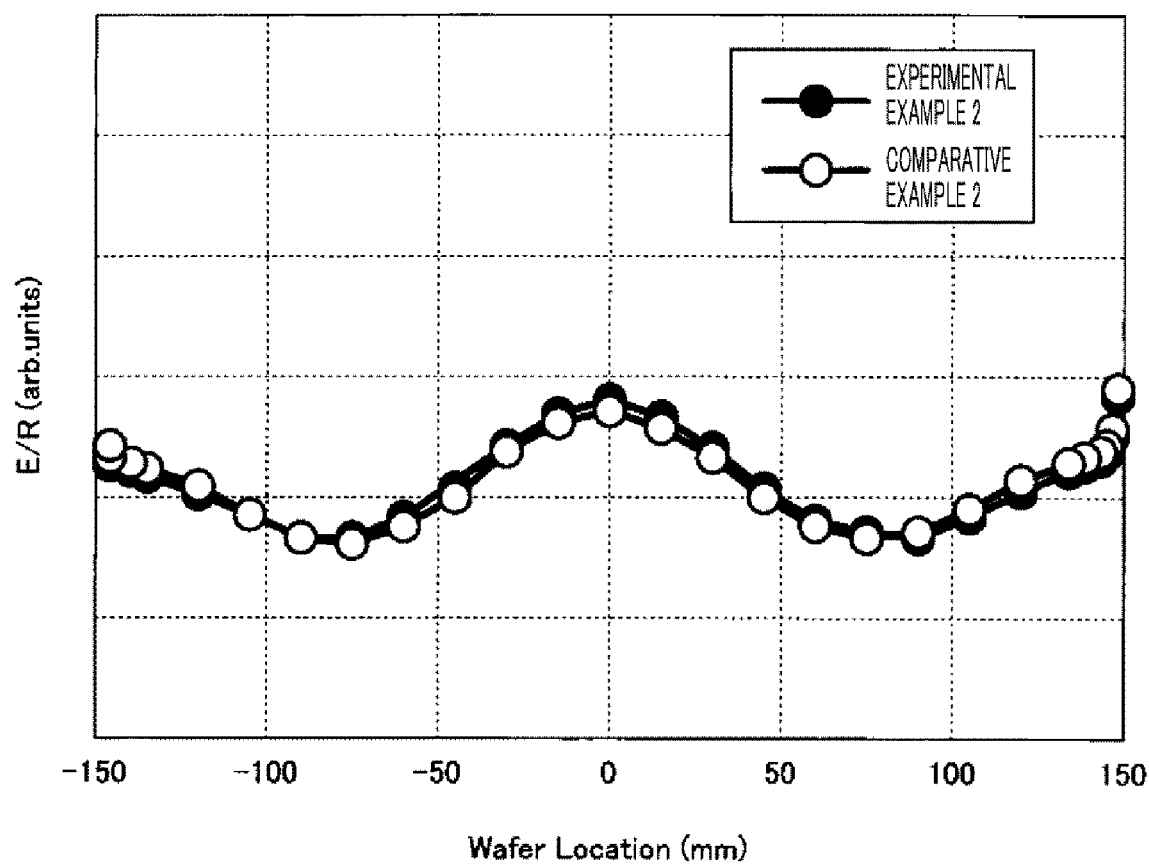
FIG. 12 is a diagram showing an evaluation result of an etching characteristic.

FIG. 12 shows a measurement result of etching rates in the experimental example 2 and the comparative example 2, and depicts a relationship between a position (mm) on the wafer W and an etching rate (arb.units).

As can be seen from FIG. 12, the etching rate in the experimental example 2 is found to be substantially equal to the etching rate in the comparative example 2. That is, the power feed member having the connecting member made of the porous metal sheet is found out to have the same degree of the electrical conductivity as the power feed member having the connecting member formed of the bulk metal.

Further, an etching characteristic in case of performing a plasma etching processing on the wafer W under a second condition by using, as each of the power feed members 70 and 71 shown in FIG. 1, the power feed member having the connecting member made of the porous metal sheet is evaluated (experimental example 3). Further, for the comparison, an etching characteristic in case of performing the plasma etching processing on the wafer W under the second condition by using, as each of the power feed members 70 and 71 shown in FIG. 1, the power feed member having the connecting member made of the bulk metal is evaluated (comparative example 3). The second condition is as follows.

<Second Condition>
Pressure: 20 mTorr (2.7 Pa)
High frequency power HF: 0 W
High frequency power LF: 2000 W
Etching gas: $O_2$ (150 sccm)
Etching time: 1 min
Wafer W: $SiO_2$/Si (ϕ300 mm)

Figure 13:
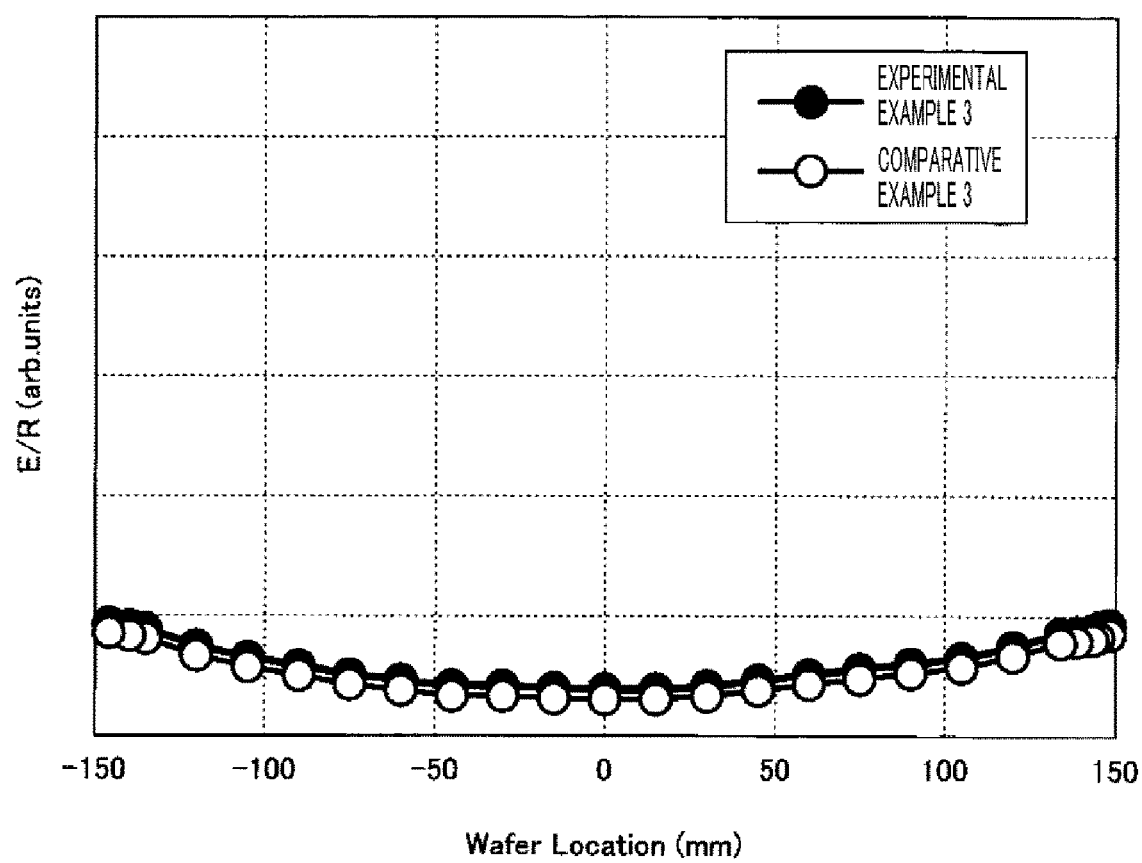
FIG. 13 is a diagram showing an evaluation result of an etching characteristic.

FIG. 13 shows a measurement result of etching rates in the experimental example 3 and the comparative example 3, and depicts a relationship between a position (mm) on the wafer W and an etching rate (arb.units).

As can be seen from FIG. 13, the etching rate in the experimental example 3 is found to be substantially equal to the etching rate in the comparative example 3. That is, the power feed member having the connecting member made of the porous metal sheet is found out to have the same degree of the electrical conductivity as the power feed member having the connecting member formed of the bulk metal.

Further, an etching characteristic in case of performing a plasma etching processing on the wafer W under a third condition by using, as each of the power feed members 70 and 71 shown in FIG. 1, the power feed member having the connecting member made of the porous metal sheet is evaluated (experimental example 4). Further, for the comparison, an etching characteristic in case of performing the plasma etching processing on the wafer W under the third condition by using, as each of the power feed members 70 and 71 shown in FIG. 1, the power feed member having the connecting member made of the bulk metal is evaluated (comparative example 4). The third condition is as follows.

<Third Condition>
Pressure: 20 mTorr (2.7 Pa)
High frequency power HF: 2400 W
High frequency power LF: 500 W
Etching gas: $O_2$ (150 sccm)
Etching time: 1 min
Wafer W: $SiO_2$/Si ($\phi$300 mm)

Figure 14:
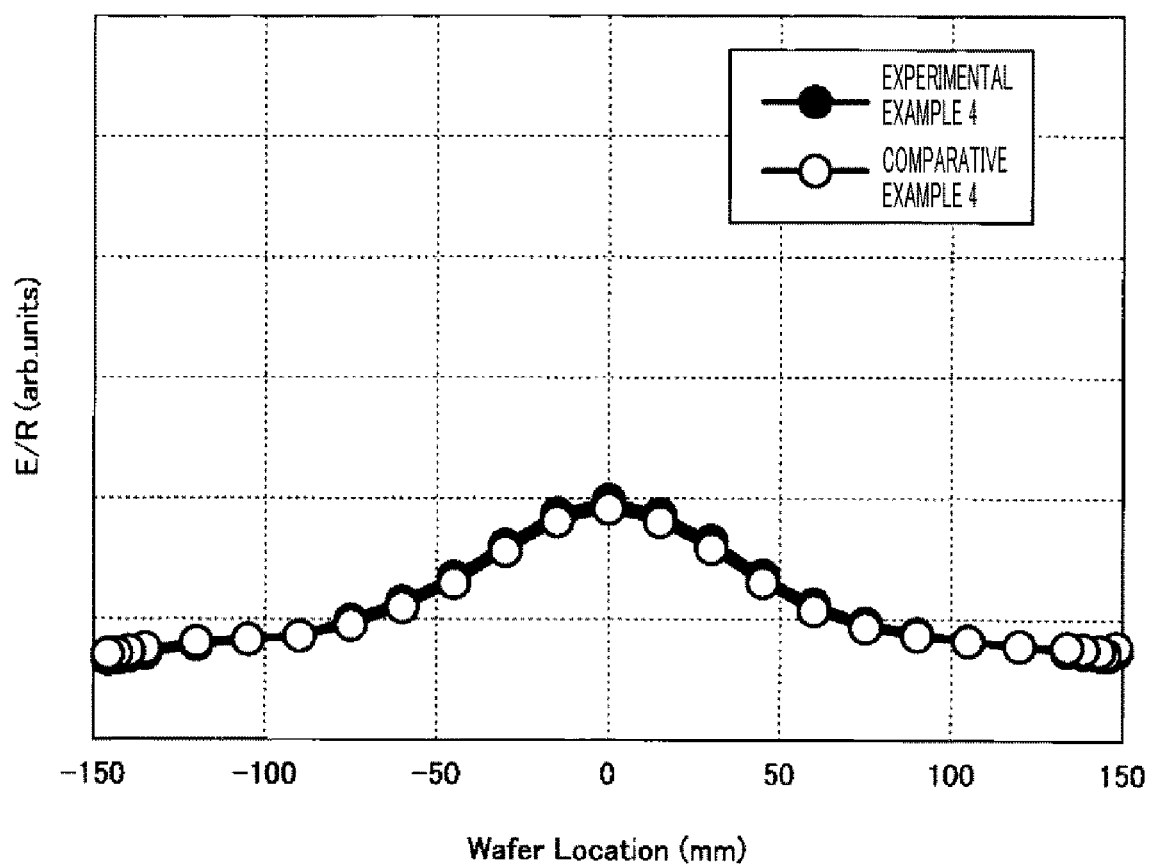
FIG. 14 is a diagram showing an evaluation result of an etching characteristic.

FIG. 14 shows a measurement result of etching rates in the experimental example 4 and the comparative example 4, and depicts a relationship between a position (mm) on the wafer W and an etching rate (arb.units).

As can be seen from FIG. 14, the etching rate in the experimental example 4 is found to be substantially equal to the etching rate in the comparative example 4. That is, the power feed member having the connecting member made of the porous metal sheet is found out to have the same degree of the electrical conductivity as the power feed member having the connecting member formed of the bulk metal.

Furthermore, an etching characteristic in case of performing a plasma etching processing on the wafer W under a fourth condition by using, as each of the power feed members 70 and 71 shown in FIG. 1, the power feed member having the connecting member made of the porous metal sheet is evaluated (experimental example 5). Further, for the comparison, an etching characteristic in case of performing the plasma etching processing on the wafer W under the fourth condition by using, as each of the power feed members 70 and 71 shown in FIG. 1, the power feed member having the connecting member made of the bulk metal is evaluated (comparative example 5). The forth condition is as follows.

<Fourth Condition>
Pressure: 20 mTorr (2.7 Pa)
High frequency power HF: 600 W
High frequency power LF: 4500 W
Etching gas: $O_2$ (150 sccm)
Etching time: 1 min
Wafer W: $SiO_2$/Si ($\phi$300 mm)

Figure 15:
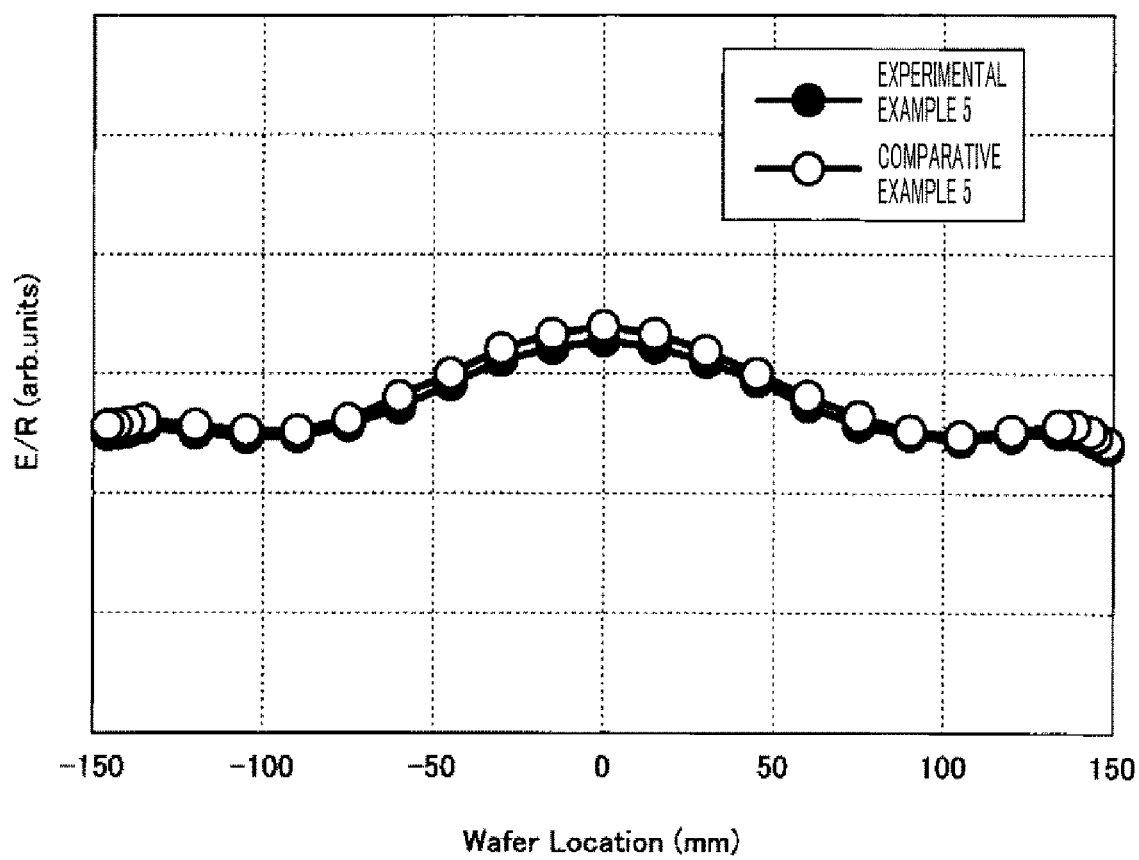
FIG. 15 is a diagram showing an evaluation result of an etching characteristic.

FIG. 15 shows a measurement result of etching rates in the experimental example 5 and the comparative example 5, and depicts a relationship between a position (mm) on the wafer W and an etching rate (arb.units).

As can be seen from FIG. 15, the etching rate in the experimental example 5 is found to be substantially equal to the etching rate in the comparative example 5. That is, the power feed member having the connecting member made of the porous metal sheet is found out to have the same degree of the electrical conductivity as the power feed member having the connecting member formed of the bulk metal.

So far, the exemplary embodiment has been described. However, the above-described exemplary embodiment is not limiting, and various changes and modification may be made within the scope of the present disclosure.

In the above-described exemplary embodiment, the power feed member 70 is used to transmit the high frequency powers generated by the first high frequency power supply 32 and/or the second high frequency power supply 34. However, the usage of the power feed member 70 is not limited thereto. By way of example, the power feed member 70 may also be used to transmit the direct current generated by the DC voltage source 112 for the electrostatic chuck. In this case, the power feed member 70 is provided between the DC voltage source 112 and the chuck electrode 106a.

The etching apparatus 1 in the present disclosure is applicable to not only the capacitively coupled plasma (CCP) apparatus but also various other types of plasma processing apparatuses. The various other types of plasma processing apparatuses may include, for example, an inductively coupled plasma (ICP) apparatus, a plasma processing apparatus using a radial line slot antenna, an electron cyclotron resonance plasma (ECR) apparatus, a helicon wave plasma (HWP) apparatus, and so forth.

Furthermore, the substrate processed by the etching apparatus 1 in the present disclosure is not limited to the wafer and may be, for example, a large-size substrate for a flat panel display, a substrate for an EL element or a solar cell, or the like.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A power feed member for a plasma processing apparatus configured to supply a power, comprising:
   a first conductive member distinct from a lower electrode and configured to be connectable with the lower electrode;
   a second conductive member made of a metal, distinct from a matching device and configured to be connectable with the matching device; and
   a connecting member configured to electrically connect the first conductive member and the second conductive member,
   wherein at least a part of the connecting member is formed of a porous metal or multiple bulk metals,
   the first and second conductive members have a disk shape,
   the connecting member includes a cylindrical portion having a diameter smaller than a diameter of the first conductive member and smaller than a diameter of the second conductive member, and a supporting member which is formed of an insulating member having a thermal insulation property and is provided in an internal space of the cylindrical shape,
wherein the porous metal is a porous metal sheet,
wherein the porous metal sheet is formed to have a cylindrical shape or a roll shape,
wherein one end of the supporting member is connected to the first conductive member and the other end thereof is connected to the second conductive member.

2. The power feed member of claim 1,
wherein the connecting member is formed of the porous metal.

3. The power feed member of claim 1,
wherein a heat transfer gas supply path, through which a heat transfer gas is flown to be supplied toward the internal space of the cylindrical shape, is formed within the supporting member.

4. The power feed member of claim 1,
wherein the connecting member is formed of multiple porous metal plates or multiple porous metal bars.

5. The power feed member of claim 4,
wherein the multiple porous metal plates or the multiple porous metal bars are arranged at symmetrical positions.

6. The power feed member of claim 1,
wherein the connecting member is formed of the multiple bulk metals.

7. The power feed member of claim 1,
wherein each of the multiple bulk metals is formed to have a bar shape or a plate shape.

8. The power feed member of claim 1,
wherein the power feed member is provided between a high frequency power supply for plasma generation and the lower electrode for plasma generation which is provided within a processing vessel configured to perform therein a preset plasma processing on a substrate,
the first conductive member is connected to the lower electrode for the plasma generation, and
the second conductive member is connected to the high frequency power supply via the matching device.

9. The power feed member of claim 1,
wherein the power feed member is provided between a DC voltage source for an electrostatic chuck and a chuck electrode for the electrostatic chuck which is provided within a processing vessel,
the first conductive member is connected to the chuck electrode, and
the second conductive member is connected to the DC voltage source.

10. A plasma processing apparatus, comprising:
a processing vessel;
an electrode for plasma generation which is provided in the processing vessel;
a high frequency power supply configured to generate a high frequency power applied to the electrode for plasma generation; and
a power feed member configured to transmit the high frequency power generated by the high frequency power supply to the electrode for plasma generation,
wherein the power feed member comprises:
a first conductive member distinct from the electrode and connected to the electrode for plasma generation;
a second conductive member connected to the high frequency power supply, the second conductive member made of a metal, distinct from a matching device and configured to be connectable with the matching device; and
a connecting member formed of a porous metal or multiple bulk metals, and configured to electrically connect the first conductive member and the second conductive member,
the first and second conductive members have a disk shape,
the connecting member includes a cylindrical portion having a diameter smaller than a diameter of the first conductive member and smaller than a diameter of the second conductive member, and
a supporting member which is formed of an insulating member having a thermal insulation property and is provided in an internal space of the cylindrical shape,
wherein the porous metal is a porous metal sheet,
wherein the porous metal sheet is formed to have a cylindrical shape or a roll shape,
wherein one end of the supporting member is connected to the first conductive member and the other end thereof is connected to the second conductive member.

11. A plasma processing apparatus, comprising:
a processing vessel;
a chuck electrode for an electrostatic chuck which is provided in the processing vessel;
a DC voltage source configured to generate a DC power applied to the chuck electrode; and
a power feed member configured to transmit the DC power generated by the DC voltage source to the chuck electrode,
wherein the power feed member comprises:
a first conductive member connected to the chuck electrode;
a second conductive member connected to the DC voltage source, made of a metal, distinct from a matching device and configured to be connectable with the matching device; and
a connecting member formed of a porous metal or multiple bulk metals, and configured to electrically connect the first conductive member and the second conductive member,
the first and second conductive members have a disk shape,
the connecting member includes a cylindrical portion having a diameter smaller than a diameter of the first conductive member and smaller than a diameter of the second conductive member, and
a supporting member which is formed of an insulating member having a thermal insulation property and is provided in an internal space of the cylindrical shape,
wherein the porous metal is a porous metal sheet,
wherein the porous metal sheet is formed to have a cylindrical shape or a roll shape,
wherein one end of the supporting member is connected to the first conductive member and the other end thereof is connected to the second conductive member.

* * * * *

UNITED STATES PATENT AND TRADEMARK OFFICE
CERTIFICATE OF CORRECTION

| | |
|---|---|
| PATENT NO. | : 10,943,766 B2 |
| APPLICATION NO. | : 16/016990 |
| DATED | : March 9, 2021 |
| INVENTOR(S) | : Shunichi Ito et al. |

Page 1 of 1

It is certified that error appears in the above-identified patent and that said Letters Patent is hereby corrected as shown below:

In the Specification

Column 10, Line 5, "AT" should be -- $\Delta T$ --.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*